United States Patent [19]

Murakami et al.

[11] 4,134,654

[45] Jan. 16, 1979

[54] PRINTED CIRCUIT UNIT FOR A CAMERA

[75] Inventors: Hiroyashu Murakami, Tokyo; Tadashi Ito, Yokohama; Fumio Ito, Yokohama; Nobuaki Sakurada, Yokohama; Masaharu Kawamura, Kawasaki; Nobuhiko Shinoda, Tokyo, all of Japan

[73] Assignee: Canon Kabushiki Kaisha, Tokyo, Japan

[21] Appl. No.: 746,297

[22] Filed: Dec. 1, 1976

[30] Foreign Application Priority Data

Dec. 2, 1975 [JP] Japan .................. 50-144159

[51] Int. Cl.² .............................................. G03B 7/00
[52] U.S. Cl. .............................. 354/60 R; 354/23 D; 354/53; 354/60 L; 354/288
[58] Field of Search ............... 354/23 D, 29, 50, 51, 354/53, 60 R, 288, 60 L; 361/397, 398; 174/68.5

[56] References Cited

U.S. PATENT DOCUMENTS

| 3,670,639 | 6/1972 | Harnden, Jr. ................ 361/398 |
| 3,846,805 | 11/1974 | Kiyohara et al. ............ 354/288 |
| 3,999,194 | 12/1976 | Imura et al. .................. 354/50 |

FOREIGN PATENT DOCUMENTS 2535329  2/1976 Fed. Rep. of Germany ........ 354/23 D

*Primary Examiner*—Russell E. Adams
*Attorney, Agent, or Firm*—Toren, McGeady and Stanger

[57] ABSTRACT

A printed circuit unit for a camera, comprising
a photo-sensing means to measure brightness of an object,
an integrated exposure operation circuit means to conduct exposure operation based on the photo-sensing output from said photo-sensing means and other exposure factors for determining a proper exposure value (an exposure time value or an exposure aperture value),
an electro-optical display means to digitally display in an optical manner the exposure value (the exposure time value and/or the exposure aperture value) within a field of view finder of the camera, and
a flexible printed circuit sheet having electrically conductive paths to electrically connect said photo-sensing means and said display means to said exposure operation circuit means,
and in said printed circuit unit, said photo-sensing means, said display means and said integrated exposure operation circuit means are mounted on said flexible printed circuit sheet, and an opening is formed at a part of said printed circuit sheet to allow the image light beam from a photo-taking lens system to impinge on a film,
and said printed circuit unit is so made that said photo-sensing means and said display means are so placed as closely facing a part of the optical assembly of the camera, and the opening at said printed circuit sheet matches with a photographing picture frame of camera, so that it is mounted in a very limited space within said camera.

35 Claims, 14 Drawing Figures

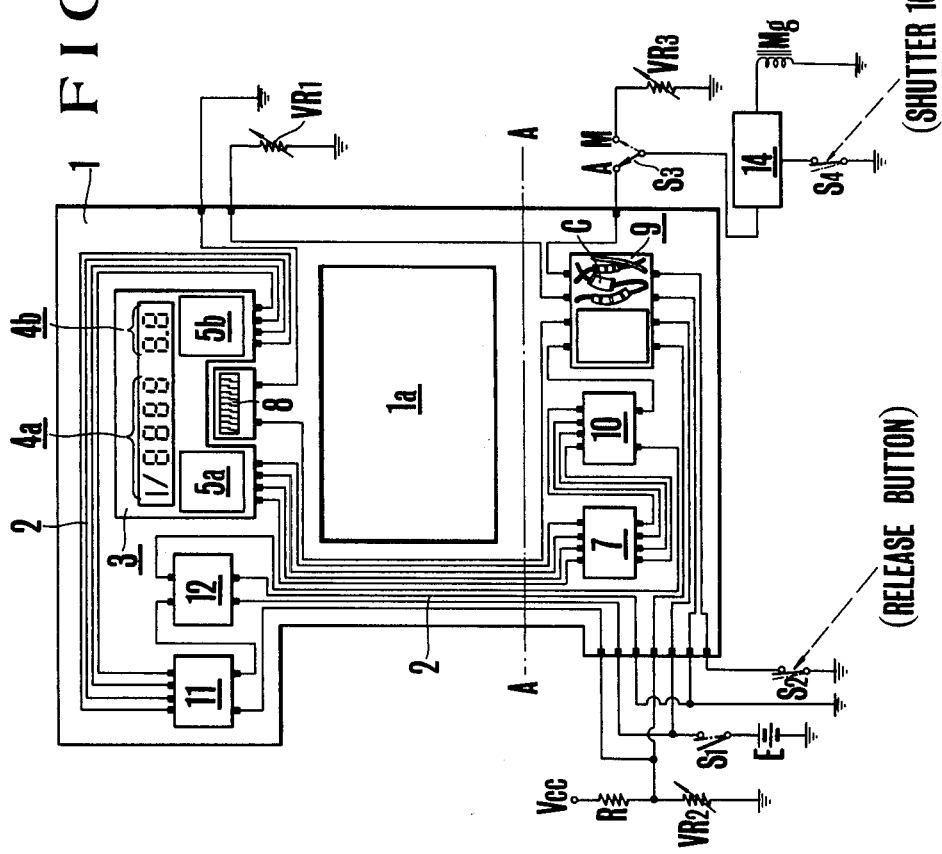
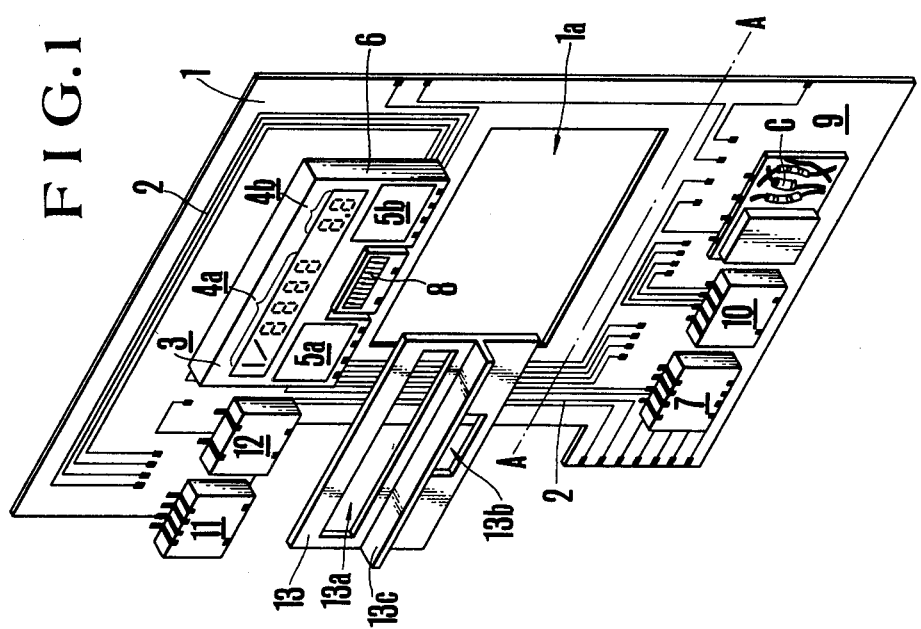

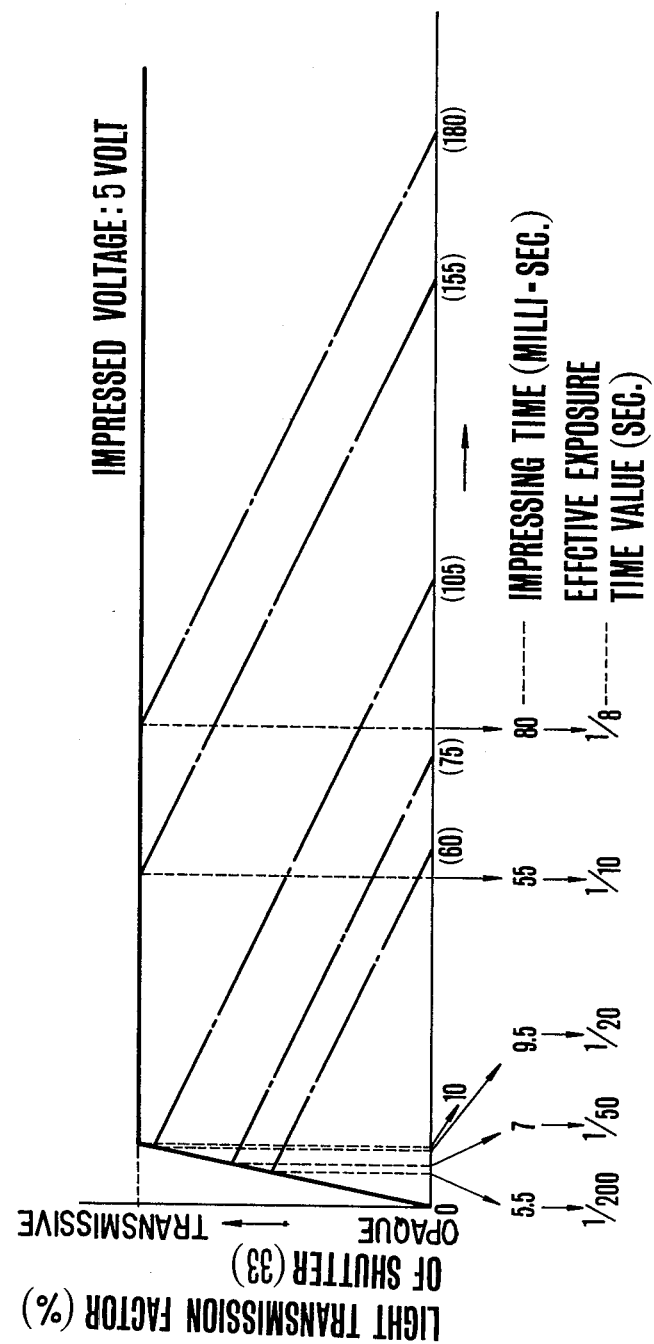

PRINTED CIRCUIT UNIT FOR A CAMERA

BACKGROUND OF THE INVENTION

1. Field of the Invention

The present invention relates to a printed circuit unit for a camera and particularly to a printed circuit unit having various functional elements (circuit paths or circuit chips) for exposure measuring, exposure operation and exposure value display, etc., mounted on a flexible printed circuit sheet.

2. Description of the Prior Art

Recently a camera employs more and more electronics technology, and it has become already general practice to conduct not only exposure measuring and operation of appropriate exposure based on the result of said measuring but also the control of exposure action thereof in an electric manner, and particularly nowadays for instance there is such system that a light emitting element such as LED (Light Emitting Diode) etc. is used so that exposure value can be digitally displayed in an electro-optical manner within a field of view finder. But in this kind of camera electric circuit devices which have become more and more large and complicated are built in the same in highly dense manner together with a number of electric circuit parts.

On the other hand, since a camera is a very equipment for which compactness in size and light weight are very valuable and important feature, various mechanical devices and optical assemblies which have already been made to have compact size are housed inside the housing thereof in a highly dense manner, thus only very small further scatteredly formed extra spaces are left for the above mentioned electric circuit systems, such as the space between an upper cover part of camera and mechanical parts or optical assemblies and the space between a bottom cover part of camera and mechanical parts. Therefore, in order to effectively utilize said very limited space, nowadays such efforts have been made to provide almost all of the above mentioned electric circuit systems in ICed (Integrated Circuited) manner as much as possible together with a vital core circuit part within the above mentioned limited space being scatteredly positioned except such electric parts as direct input and output interfaces for each of mechanical assemblies and optical assemblies, for example, various resistors to set film sensitivity, exposure time value or exposure aperture value, photo-sensing element, various switches, electro-magnet to control the action of shutter device or diaphragm device, and a display means to display exposure value, etc. In this case, further new and improved positional arrangement of each of said scatteredly positioned IC circuit parts and electric parts together with the form or arrangement of the electrical connections between said parts will be required.

Especially, as has been mentioned above, when the brightness of an object is measured by a photo-sensing element and the exposure value (the exposure time value or the exposure aperture value) to obtain appropriate exposure is operated based on the result of said measurement, further said exposure value (exposure time and/or aperture value) is optically displayed within a field of view finder by an electro-optical display element for example a light emitting element, a liquid crystal element, etc., since said photo-sensing element and display element are to constitute direct input and output interfaces for the optical assembly of camera, they need to be positioned closely facing to a part of the optical system of camera for example the view finder optical system. And in this case, the position at which each of said photo-sensing element and display element is placed will have limitations depending on the positional layout of the optical assembly of camera in view of the requirements for satisfying such conditions that the display information light beam from the display element must not impinge on the photo-sensing element to impair the photo-sensing accuracy, and the photo-sensing element must be able to measure object brightness accurately, further the display information by the display element must be visually recognized within the field of view finder without any difficulties, etc.

On the other hand, an exposure operation circuit to determine appropriate exposure value based on the photo-sensing output from the photo-sensing element, even if they are formed by IC into one or more IC chips, is ordinarily mounted for example using the space between a camera bottom cover and mechanical part or the space between a camera upper cover and a pentaprism constituting the view finder optical system of camera, from the view point of convenience for adjustment thereof and for built-in operation thereof into a camera, therefore, there is a problem for wiring for electrical connection between the exposure operation circuit and the photo-sensing element and display element. If thus scatteredly positioned IC circuit parts and each of electric parts are connected by conventional lead wires, especially its wiring operation becomes very complicated and assembly work of camera becomes very difficult, further such fear as an increase in troubles by damage on the lead wire or failure in connection, etc. is generated, further there will be such disadvantages that the positional layout of various mechanical assemblies and optical assemblies of camera will be greatly influenced by said complication, difficulty and fear. Thus a further improved set up and positional arrangement for electric circuit systems are strongly desired to satisfactorily eliminate these disadvantages.

SUMMARY OF THE INVENTION:

The present invention is made in view of the above and has an object to provide such more improved and unique arrangement as totally eliminating said disadvantages as the set up and positional arrangement of electric circuit systems, which performs various function mentioned below, when object brightness is measured by a photo-sensing element and appropriate exposure value is determined by an exposure operation circuit means based on the result of said measurement and said determined exposure value and/or pre-set exposure value are displayed optically within the view finder field of camera by an electro-optical display means.

Another object of the present invention is to provide such further improved set up and arrangement of electric circuit systems that the set up and positional arrangement of the above mentioned electric circuit systems performing the above mentioned function are made small in dimension by forming the vital core circuit part thereof with IC and the wiring between said IC circuit part and said photo-sensing means and said display means is reduced, and at a same time the positional layout of various mechanical assemblies and optical assemblies at an inside of camera is made easy, further the complications in positional layout of said electric circuit systems within camera are satisfactorily eliminated.

Further another object of the present invention is to provide an improved set up and arrangement of said electric circuit systems when while TTL photo-sensing is done in a single lens reflex camera, the exposure value information is digitally displayed in an electro-optical manner within a field of view finder of camera, particularly being suited to the positional arrangement and layout of the view finder optical assembly in said camera.

For achieving said objects in the present invention such set up and arrangement of the electric circuit systems are proposed that one printed circuit unit is constituted by a flexible printed circuit sheet having electrically conductive paths to electrically connect the photo-sensing means, an integrated exposure operation circuit means, and a digital display means, further to electrically connect said photo-sensing means, the display means and other electric circuit parts to the integrated exposure operation circuit means, wherein said photo-sensing means, the display means and the integrated exposure operation circuit means are mounted on said flexible printed circuit sheet, and at a same time an opening is formed in said flexible printed circuit sheet to allow the image light beam from a photo-taking lens system to reach a film, so that said photo-sensing means and the display means are closely facing to the view finder optical assembly of camera and said opening in the flexible printed circuit sheet matches with the photographing picture frame of camera, thus these parts can be mounted within the limited space in said camera.

Further another object of the present invention is to provide an improved arrangement as the electric circuit system performing the above mentioned function is mounted to a view finder adaptor being so made as can be mounted to and dismounted from the camera body, being suited to the positional arrangement and layout of the view finder optical assembly in said finder adaptor.

To achieve said objects such arrangement of the electric circuit systems is proposed in the present invention that one printed circuit unit is formed by a flexible printed circuit sheet having electrically conductive paths and terminals to electrically connect the photo-sensing means, an integrated exposure operation circuit means, the digital display means, further to electrically connect said photo-sensing means, the display means and other electric circuit parts to the integrated exposure operation circuit means, wherein said photo-sensing means, the display means and the integrated exposure operation circuit means are mounted on said flexible printed circuit sheet, and at a same time a cut-out part is formed in said flexible printed circuit sheet to allow the light beam passing through the view finder optical assembly at said finder adapter to be exited out of said view finder, so that said photo-sensing means and the display means are closely facing to the view finder optical assembly of said finder adapter and said cut-out part in the flexible printed circuit sheet matches with the view finder field of said finder adapter, thus such arrangement is proposed that said parts can be mounted to the limited space of said finder adapter in the above mentioned manner.

Still another object of the present invention is to provide an electric device performing the function of exposure setting together with the function of measuring exposure, operation of exposure based on the result of said measurement and electro-optical display of said operation result, in a form of one unit being formed by IC's as much as possible, together with other objects of the invention.

And to achieve said object such printed circuit unit is proposed in the present invention that further, a physico-optical shutter for example a shutter consisting of liquid crystal layer is mounted on said flexible printed circuit sheet having the same faced to the above mentioned opening on said printed circuit sheet in said printed circuit unit so that said shutter is controlled based on the output from said exposure operation circuit.

Further objects and characterizing features of the present invention will be made apparent from the description made in reference to the attached drawings given below.

BRIEF DESCRIPTION OF THE DRAWINGS

Now explanations will be made on the drawings on some examples of the present invention.

FIG. 1 is an external oblique view to show a set up of a first example of a printed circuit unit according to the present invention.

FIG. 2 is a front view of the printed circuit unit shown in FIG. 1.

FIG. 2 is mounted to said camera.

FIG. 9 is a graph to show a relationship between a driving time of the physico-optical shutter shown in FIG. 6 and FIG. 7 and an effective exposure time obtained thereby.

DETAILED DESCRIPTION OF THE PREFERRED EMBODIMENTS

Figure 3:
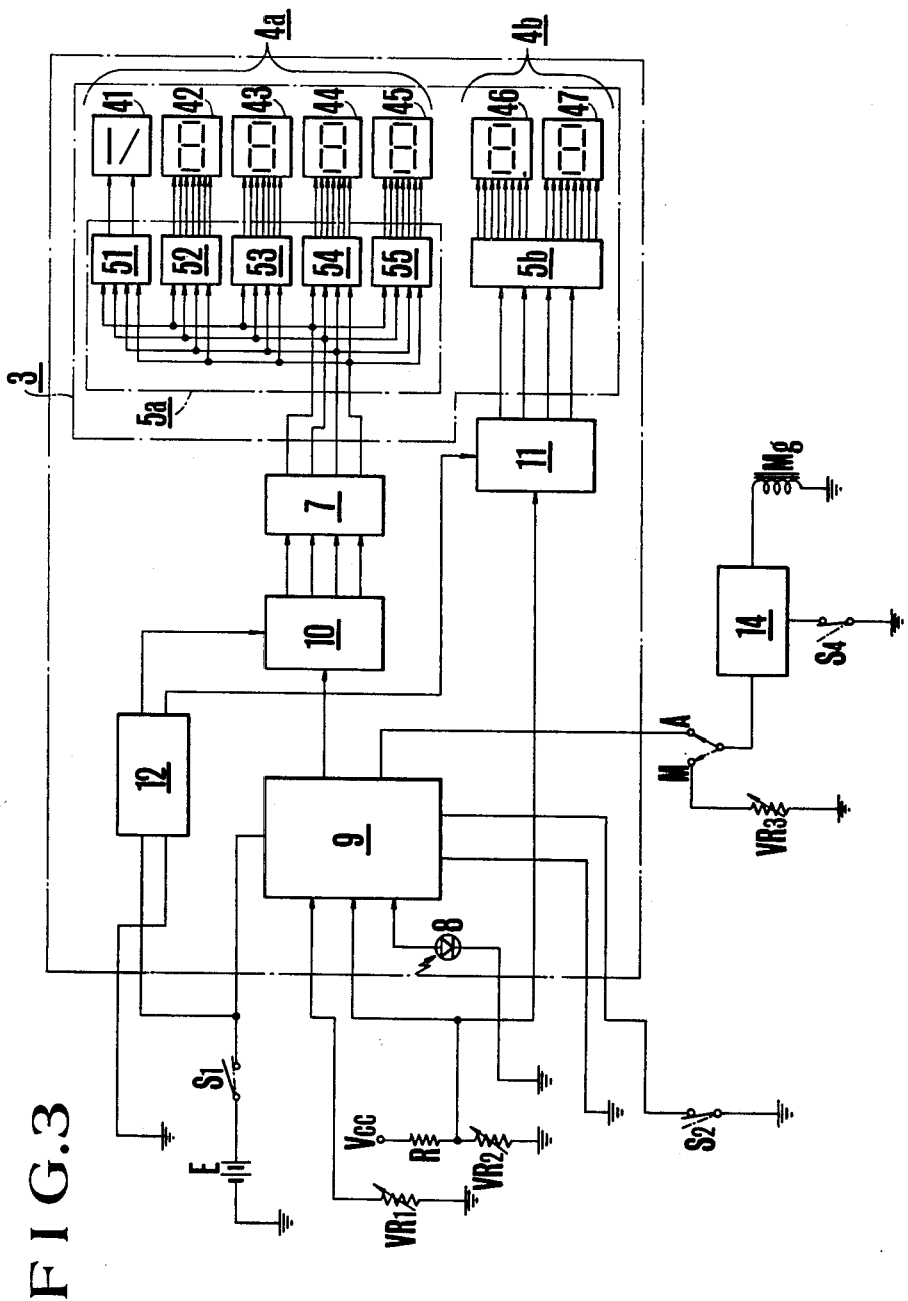
FIG. 3 is a block diagram to show the arrangement of circuits in the printed circuit unit shown in FIG. 1 and FIG. 2 and the manner of connections of said circuits in a camera.

First, explanations will be made on a first example of a printed circuit unit according to the present invention. What is shown as 1 in FIG. 1 is a flexible printed circuit sheet made of heat-resistant insulating type of synthetic resin material of polyester type or of polyimide type, etc., and an opening 1a being larger than a photographing picture frame of camera if formed at a position corresponding to said picture frame at a portion of said sheet, further electrically conductive paths 2 are formed by printing on the surface of said sheet.

What is shown as 3 is an electro-optical display means which houses in compact manner light emitting elements 4a and 4b (for example LED-Light Emitting Diode, etc.) of seven segments for exposure value display and decoder-driver circuits 5a and 5b to drive said light emitting elements 4a and 4b within one insulating type casing 6 forming the same in a packaged manner, wherein the light emitting element 4a is applied to electro-optically display exposure time value while the light emitting element 4b is to display exposure aperture value within a view finder field of a camera, also the decoder-driver circuit 5a is used to drive the light emitting element 4a, while the decoder-driver circuit 5b is used to drive the light emitting element 4b.

Also as shown in FIG. 3 said light emitting element 4a consists of a display part 41 for displaying fraction values and display parts 42 to 45 for displaying four figures, while the light emitting element 4b consists of two displays parts 46 and 47.

And said decoder-driver circuit 5a consists of such number of decoder-drivers 51 to 55 as corresponding to the number of said display parts 41 to 45 of the light emitting element 4a, wherein especially the decoder-driver 51 to drive the fraction value display part 41 is so made as driving said fraction value display part 41 only when the information recorded in a register 7 displays exposure time value of below ½ second (that is shorter than ½ second).

What is shown as 8 is a photo-sensing element to measure brightness of an object and is placed near said display means 3. What is shown as 9 is an exposure operation circuit of analogue type to conduct exposure operation based on the photo-sensing output from said photo-sensing element 8, the film sensitivity value provided by a variable resistor VR1 (shown in FIG. 2, FIG. 3), and the preset exposure aperture value provided by a variable resistor VR2 (shown in FIG. 2, FIG. 3, FIG. 4) for determining the proper exposure time value, and is made with IC's as much as possible except for example a condensor C for memory, etc.

What is shown as 10 is an A-D (Analogue-Digital) converter to convert the analogue output from said exposure operation circuit 9 into for example digital signal of 4 bit, and said register 7 records the output of said A-D converter 10. What is shown as 11 is an A-D converter to convert the analogue signal (preset exposure aperture value) provided by said variable resistor VR2 into digital signal of 4-bit and to give the same to said decoder-driver circuit 5b, and what is shown as 12 is a clock pulse generator to provide clock pulse for said A-D converters 10 and 11. Also general purpose type of circuit chips being made with IC's can be used as said register 7, A-D converters 10, 11 and clock pulse generator 12.

What is shown as 13 is a masking plate to prevent the display information light beam from said light emitting elements 4a and 4b from impinging into said photo-sensing element 8 to deteriorate the photo-sensing accuracy, and has an opening 13a corresponding to said photo-sensing elements 4a and 4b, an opening 13b corresponding to said photo-sensing element 8, and a light-shielding part 13c positioned between said openings 13a and 13b, further is fixed on said display means 3 by such method as adhesion etc. when the printed circuit unit is assembled.

When the printed circuit unit consisting of the above mentioned component elements is assembled, each of said circuit paths is mounted on the flexible printed circuit sheet 1 and is electrically connected by such means as soldering, etc. utilizing conductive paths 2 formed on said printed circuit sheet 1, and said manner of connection is shown in FIGS. 2 and 3.

That is, the decoder-driver circuits 5a, 5b in said display means 3 are connected respectively to the register 7 and the A-D converter 11, while the A-D converter 10 is connected to the register 7 and the exposure operation circuit 9. Also the photo-sensing element 8 is connected to the exposure operation circuit 9 and the clock pulse generator 12 is connected to the A-D converters 10 and 11.

Figure 4:
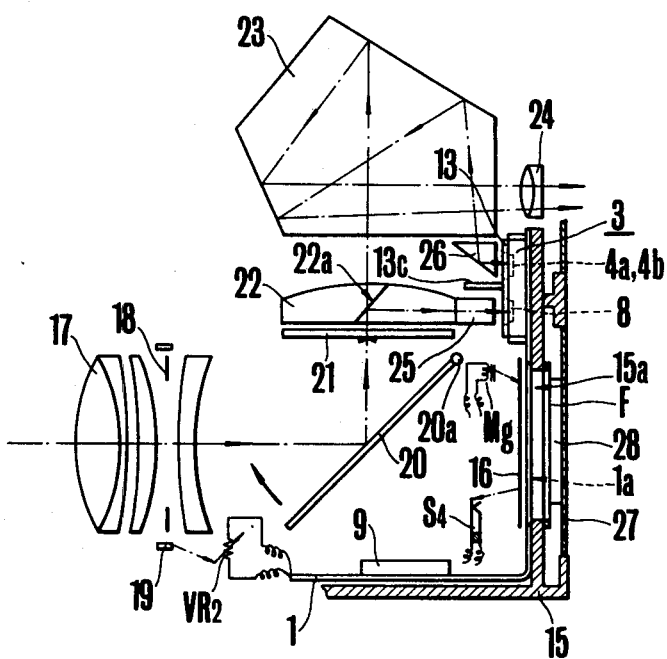
FIG. 4 is a schematic explanatory drawing to show a layout in a single lens reflex camera as the printed circuit unit shown in FIG. 1

And the printed circuit unit thus assembled is mounted in a camera using the space between a camera casing body 15 and a shutter 16 as an example being bent along the line A—A depending on the limited space within a single lens reflex camera as shown in FIG. 4, in such manner that the opening 1a in the flexible printed circuit sheet 1 matches with an opening 15a formed at a part of said camera casing body 15 and the photo-sensing element 8 matches with a prism 25 for photo-sensing in a view finder optical system of camera, further the light emitting elements 4a and 4b match with a reflective prism 26 for display at the view finder optical system of camera, wherein various electrical parts scatteredly positioned within said camera are electrically connected by such methods as soldering, etc. to each of circuit paths in said printed circuit unit utilizing the conductive paths 2 formed on said printed circuit sheet 1. That is, as shown in FIGS. 2 and 3, the above mentioned variable resistor VR1 for setting film sensitivity is connected to the exposure operation circuit 9, also the variable resistor VR2 for setting exposure aperture value is connected to the exposure operation circuit 9 and the A-D converter 11 together with a voltage dividing resistor R.

Also what is shown as E is a power source and is connected to the exposure operation circuit 9 and clock pulse generator 12 together with a power source switch S1. Also what is shown as S2 is a memory switch actuated by a release button not being shown in the drawing and is connected to a memory condensor C at the exposure operation circuit 9. Also what is shown as 14 is a conventionally known shutter control circuit and is connected to the above mentioned exposure operation circuit 9 by a change over switch S3 to change over the exposure action mode between an automatic control mode "A" and a manual control mode "M," when said switch S3 is changed over to "A."

Also what is shown as S4 is a conventionally known switch for initiating exposure time counting linked with an opening action of said shutter 16, and what is shown as Mg is an electro-magnet to control a closing action of said shutter 16, while what is shown as VR3 is a variable resistor to manually set the exposure time value and is connected to a shutter control circuit 14 by said switch S3 when said switch S3 is changed over to "M" side. Also in FIG. 4, what is shown as 17 is a photo-taking lens system and what is shown as 18 is a diaphragm provided within said lens system, while what is shown as 19 is a preset ring to preset the exposure aperture value, wherein the above mentioned variable resistor VR2 for setting the exposure aperture value is operatively connected to said preset ring 19 to provide such electric signal as corresponding to the exposure aperture value preset by said preset ring 19 to the above mentioned exposure operation circuit 9 and A-D converter 11.

What is shown as 20 is a connectionally known movable reflex mirror axially supported by an axle 20a in a rotatable manner, and what is shown as 21 is a focusing plate, while what is shown as 22 is a condensor lens having an obliquely set semi-transmitting plane 22a formed at its central part, wherein the above mentioned photo-sensing prism 25 is provided at such position as closely facing the edge of said condensor lens 22 in such manner as having the light beam reflected from said semi-transmitting plane 22a impinge into said photo-sensing element 6.

What is shown as 23 is a penta prism, and what is shown as 24 is an eye piece lens, wherein said reflective prism 26 for display has the display information light beam from the light emitting elements 4a and 4b impinge into said penta prism 23 and is so positioned as closely facing the bottom plane of said penta prism 23.

What is shown as F is a film and what is shown as 27 is a back cover of a camera and what is shown as 28 is a pressing plate to hold film down. Also as the above mentioned printed circuit unit is mounted to a camera, the light shielding part 13c of the masking plate 13 is positioned between the photo-sensing prism 25 and the reflective prism 26 for display, thereby such fear is effectively eliminated that the display information light beam from the light emitting elements 4a and 4b impinges into the photo-sensing element 8 to impair the photo-sensing accuracy.

Next, explanations will be made on the action of the printed circuit unit so provided in a camera as mentioned above together with photo-taking action of camera referring particularly to FIG. 3. First, when the power source switch S1 is placed in ON state in a state that the variable resistor VR1 is set in accordance with the sensitivity of the film F used and any exposure aperture value is selected by the preset ring 19, the exposure operation circuit 9 and the clock pulse generator 12 will start their action.

That is, first the exposure operation circuit 9 conducts exposure operation based on the film sensitivity information provided by the variable resistor VR1, and the exposure aperture value information provided by the variable resistor VR2 linked with the preset ring 19, further the object brightness information provided by the photo-sensing element 8, to determine proper exposure time value, thus outputting such analogue signal as corresponding to said exposure time value to the A-D converter 10 (here, at this time if the switch S3 is changed over to "A" as shown in the drawing that is if the exposure action mode is set at an automatic control mode, the analogue signal at this time will be also given to the shutter control circuit 14).

On the other hand at this time the clock pulse generator 12 will output clock pulse to the A-D converters 10 and 11.

By this, first the A-D converter 10 digitally converts the analogue output from the exposure operation circuit 9 into the digital signal of 4-bit based on the clock pulse given by the clock pulse generator 12, then gives the same to the registor 7, thereby the decoder-driver circuit 5a drives the display parts 41 to 45 at the light emitting element 4a respectively depending on the information content recorded at said registor 7, thus finally the proper exposure time value determined by the exposure operation circuit 9 will be digitally displayed in an electro-optical optical manner within a field of view finder by said light emitting element 4a.

Therefore, at this time, if the exposure action is set at the manual control mode, that is if the switch S3 is changed over to "M" side, proper exposure time value can be manually set at the shutter control circuit 14 by adjusting the variable resistor VR3 based on the exposure time value information displayed within the view finder field by said light emitting element 4a.

On the other hand at this time, the A-D converter 11 converts the analogue signal provided by the variable resistor VR2 into digital signal of 4-bit based on the clock pulse outputted from the clock pulse generator 12, and gives the same to the decoder-driver circuit 56, thereby said decoder-driver circuit 56 drives the display parts 46, 47 at the light emitting element 4b, thus finally the exposure aperture value being preset by the preset ring 19 will be digitally displayed in an electro-optical manner within the view finder field by said light emitting element 4b.

Figure 5:
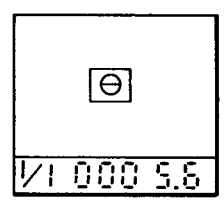
FIG. 5 is a schematic explanatory drawing to show a manner of display of exposure value information within a field of a view finder of camera.

The state of display of exposure value at this time within the view finder field of camera by the display means 3 will be as shown in FIG. 5.

Now in said drawing, the exposure aperture value preset by the preset ring 19 is "F 5.6" and the proper exposure time value at this time is "1/1000 (sec.)."

When a release button not shown in the drawing is pressed in this state, first, the switch S2 for memory is actuated, thereby the above mentioned proper exposure time value will be memorized by the memory condensor C in the exposure operation circuit 9 (therefore, even when the reflex mirror 20 is retreated to outside of photographing light path thereafter, thereby the amount of incident light into the photo-sensing element 8 varies and the output of said photo-sensing element 8 varies, the display state by the light emitting element 4a will not be changed at all, thus the above mentioned display of proper exposure time value will be continued as it is.

And after that, at a same time when the reflex mirror 20 is retreated to outside of photographing light path by further depression of the release button, the diaphragm 18 is stopped down to the exposure aperture value preset by the preset ring 19 by a conventionally known diaphragm driving mechanism, then as the shutter 16 is released, the switch S4 for initiating counting is actuated in an association therewith, thus the shutter control circuit 14 performs the counting of exposure time based on the exposure time information provided by the exposure operation circuit 9 (to be exact by the memory condensor C within said circuit 9) when the switch S3 is changed over to "A" side, or based on the exposure time information set by the variable resistor VR3 when the switch S3 is changed over to "M" side, and the electro-magnet Mg is energized (or deenergized) after completion of said counting of exposure time to close the shutter 16.

Photographing is done in the manner mentioned above.

Next, explanations will be made on a second example of the printed circuit unit according to the present invention, wherein the printed circuit unit in this second example differs from the above mentioned printed circuit unit in the first example, first in such feature that a physico-optical shutter containing for example a liquid crystal layer is mounted at a position corresponding to the opening 1a of the flexible printed circuit sheet 1, and in such feature that a control circuit to control said shutter is housed within one casing together with all circuit parts in the first example for forming the same in a packaged manner, further in such feature that a battery box to house a power source battery for said circuit paths is mounted on the printed circuit sheet 1.

Therefore in the explanations of this second example, such component elements as duplicating with those in the printed circuit unit in the first example will be identified with same numbers or symbols as in said first example, and duplicating explanations will be omitted as long as not hindering the explanations of the second example.

Figure 6:
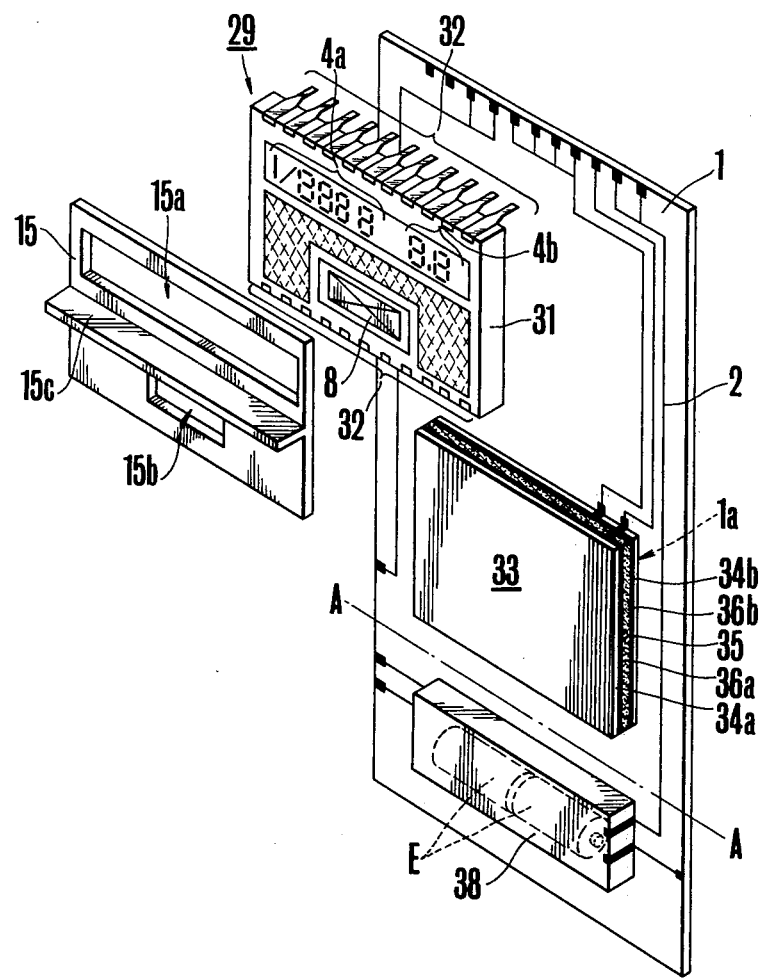
FIG. 6 is an external oblique view to show a set up of a second example of a printed circuit unit according to the present invention.
Figure 7:
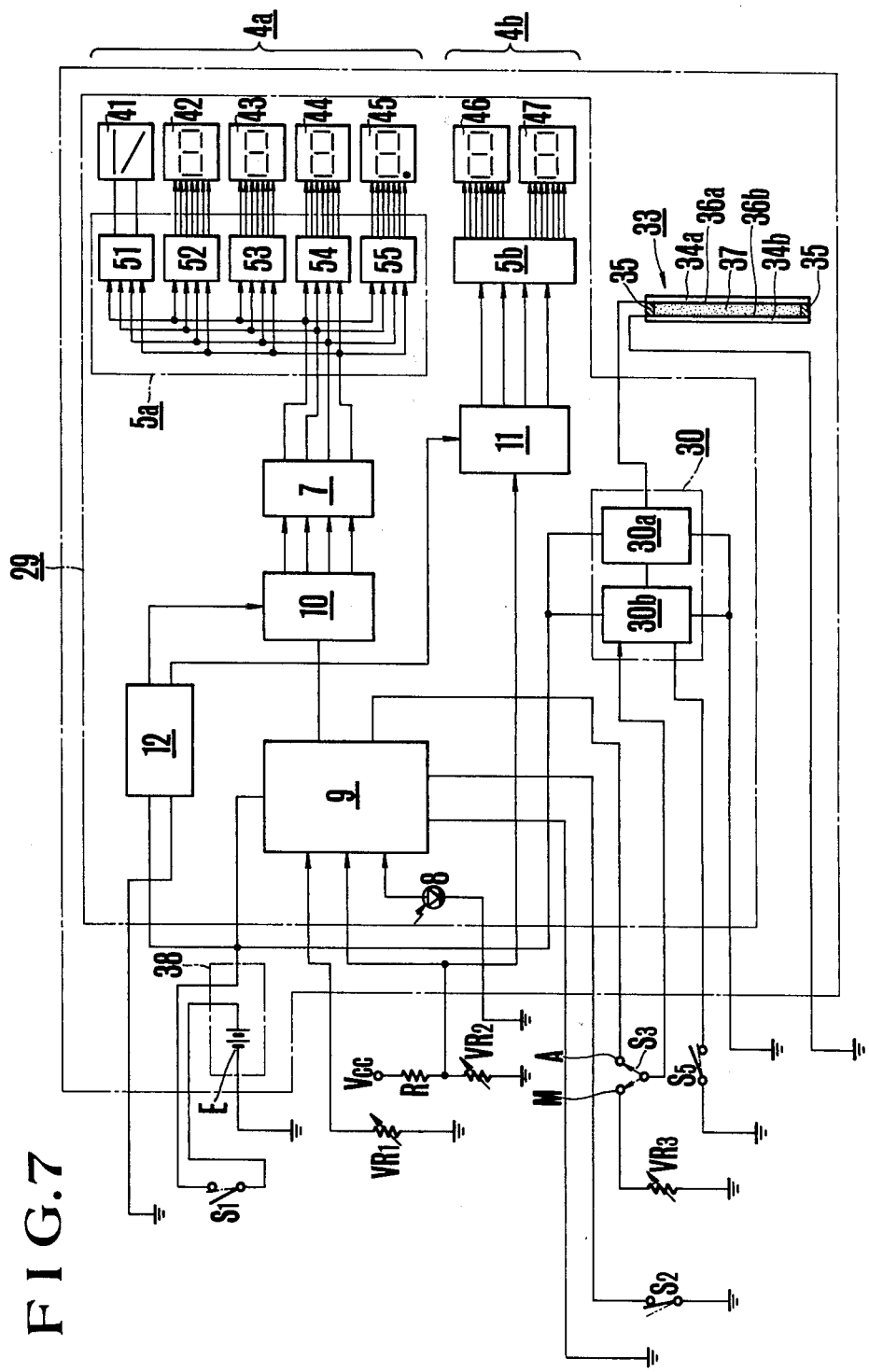
FIG. 7 is a block diagram to show a set up of the circuits in the printed circuit unit shown in FIG. 6 and a manner of connections of said circuits in a camera.

First in FIG. 6, what is shown as 29 is an automatic exposure control unit performing all functions for measuring exposure, exposure value display and exposure control, and said control unit 29 has such set up as shown in FIG. 7 that the above mentioned light emitting elements 4a and 4b, the decoder-driver circuits 5a and 5b, the register 7, the photo-sensing element 8, the exposure operation circuit 9, the A-D converters 10 and 11, the clock pulse generator 12 and the shutter control circuit 30 which is used for controlling a physico-optical shutter to be described later and is formed with IC's as much as possible except for example a condensor for time constant, etc. are housed compactly in one insulating casing 31 and is formed in a packaged manner.

What is shown as 32 is terminal group to connect said unit 29 to the conductive paths of the flexible printed circuit sheet 1. What is shown as 33 is an electric shutter of physico-optical type made by filling the space formed by two polarization plates 34a, 34b having transparent electrodes 36a, 36b and an insulating type spacer 35, with liquid crystal 37 of field effect type, and said electric shutter 33 is mounted on said printed circuit sheet 1 in such manner as covering said opening 1a of said printed circuit sheet 1 as the printed circuit unit is assembled, then said electrodes 36a and 36b are connected to the conductive paths 2 formed on the printed circuit sheet 1 respectively.

Said electric shutter of physico-optical type means a shutter to control the incidence of the light beam onto film plane utilizing such characteristics as having optical properties varies by having external energy such as electric field, magnetic field, heat, etc. of such material as utilizing Faraday effect or crystal of field effect actuation type or of dynamic scattering type, or utilizing magnetic power material. This example uses a liquid crystal of the field effect type.

Also said shutter control circuit 30 consists of an alternating voltage generation circuit 30a to impress alternating voltage of 5 volts onto said shutter 33 and a switching circuit 30b to determine the voltage impressing time onto said shutter 33 based on the output from said exposure control circuit 9 for controlling said alternating voltage generation circuit 30a, wherein said switching circuit 30b is connected to the exposure operation circuit 9.

What is shown as 38 is a battery box to house the power source battery E for said unit 29, and is mounted on the above mentioned printed circuit sheet 1 as the printed circuit unit is assembled, and is connected to the conductive paths 2 formed by printing on said printed circuit sheet 1. What is shown as 39 is an opening and closing cover provided at a bottom part of the camera casing body 15 for loading the battery E from outside of camera into said box 38 and for taking out the same from said box 38.

Figure 8:
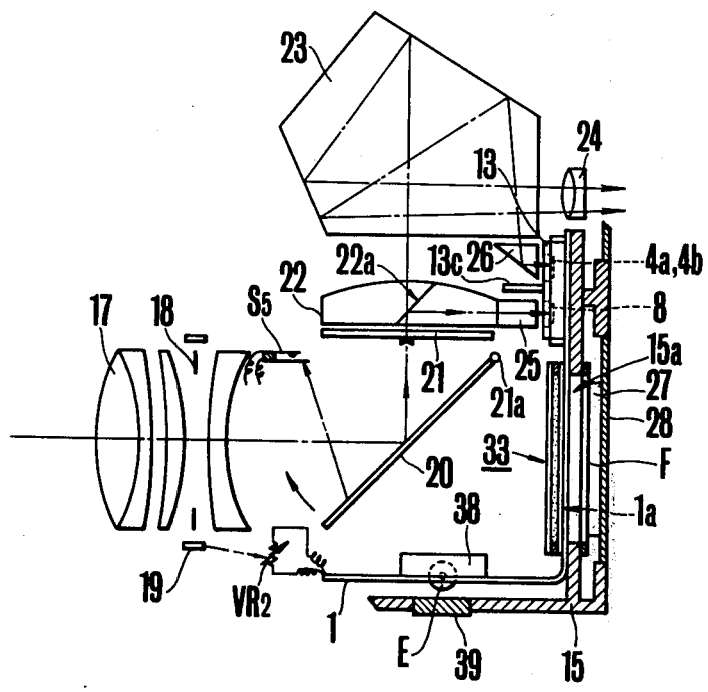
FIG. 8 is a schematic explanatory drawing to show a layout in a single lens reflex camera as the printed circuit unit shown in FIG. 6 is mounted to said camera.

A manner in which the printed circuit unit consisting of the above mentioned component elements is mounted at a single lens reflex camera is shown in FIG. 8 and a manner of electric connection between various electric parts being scatteredly positioned in said camera and said printed circuit unit is shown in FIG. 7, wherein the manner of the mounting and of connection in this case are virtually same as the case of said first example as being apparent by referring to FIG. 3 and FIG. 4, therefore detailed explanations thereof will be omitted.

Now in FIGS. 7 and 8, what is shown as S5 is a switch for shutter triggering being actuated as said mirror 20 is completely retreated to outside of phototaking light path in an association with said reflex mirror 20, and is connected to said shutter control circuit 20 as in the above mentioned change over switch S3.

Also the movable reflex mirror 20 is so made as being returned to a position shown in FIG. 8 when the depression of release button is released or in an association with the film wind up action.

Next, explanations will be made on the action of the printed circuit unit having the above mentioned set up together with the action of camera.

First, when the power source switch S1 is closed after the film sensitivity and exposure aperture values are set respectively various circuit parts function similarly in the case of the above mentioned Example 1, the preset exposure aperture value is digitally displayed within the view finder field by the light emitting element 4b, while the proper exposure time value is also so displayed by the light emitting element 4a.

Therefore, when manual exposure control is desired, proper exposure time value can be manually set at the shutter control circuit 30 by adjusting said variable resistor VR3 according to the proper exposure time value displayed by the light emitting element 4a in a state in which the switch S3 is changed over to "M" side and the variable resistor VR3 is connected to the shutter control circuit 30.

When a release button not shown in the drawing is depressed in this state, after the switch S2 is actuated, the switch S5 is actuated at a time when the diaphragm 18 is stopped down by the preset ring 19 to the preset exposure aperture value and at a same time the reflex mirror 20 is retreated to outside of photographing light path, and said mirror 20 is completely retreated to outside of photographing light path.

And when the switch S5 is actuated the switching circuit 30b in said shutter control circuit is actuated to start impressing of alternating voltage onto the shutter 33 by the alternating voltage generation circuit 30a, and at a same time the impressing time of the alternative voltage required to obtain proper exposure is counted based on the exposure time value, which is determined by the above mentioned exposure operation circuit 9 when the switch S3 is changed over to "A" side and is set by the above mentioned variable resistor VR3 when the switch S3 is changed over to "M" side, and after completion of said counting of the impressing time, the impressing of the alternating voltage by the alternating voltage generation circuit 30a is stopped.

Here, the relationship between the impressing time of the alternating voltage onto the shutter 33 and the effective exposure time obtained thereby is as shown in FIG. 9, and for instance, when the impressed voltage onto the shutter 33 is 5 volts and the impressing time is 5.5 milliseconds, effective exposure time equivalent to about 1/200 second can be obtained, also when the impressing time is made as about 80 milli-seconds, effective exposure time equivalent to about ⅛ second is obtained.

Figure 10:
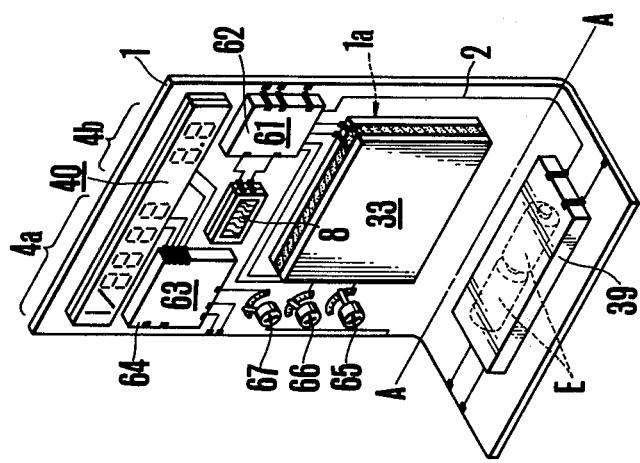
FIG. 10 is an external oblique view to show a set up of a third example of a printed circuit unit according to the present invention.
Figures 13, 14:
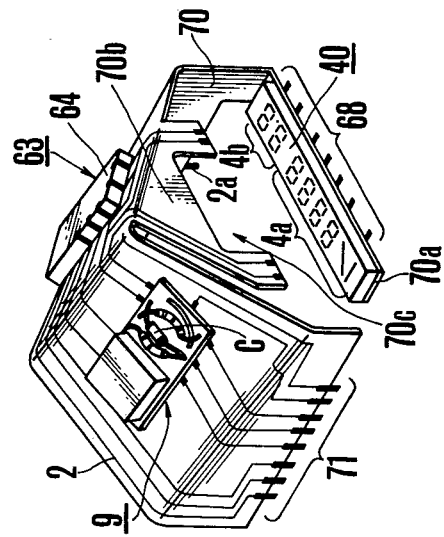
FIG. 13 is an external oblique view to show a set up in a case when a printed circuit unit according to the present invention is so made as can be mounted to a view finder adapter which is freely mountable to or dismountable from a camera body, as a fifth example of said unit according to the present invention.
FIG. 14 is a schematic explanatory drawing to show a manner of layout of the printed circuit unit shown in FIG. 13 at a view finder adapter as it is mounted to said adapter.

Next, FIG. 10 is to show a third example of a printed circuit unit according to the present invention, wherein circuit parts performing exposure operation and exposure control and circuit parts performing the display of exposure value are mounted separately on the flexible printed circuit sheet 1 as separate circuit units, and are connected to the shutter 33 and the light emitting elements 4a and 4b respectively by the conductive paths 2 formed on said printed circuit sheet. That is in this drawing, what is shown as 61 is a circuit unit housing the exposure operation circuit 9 and shutter control circuit 30 within one casing 62 in a packaged form, and what is shown as 63 is a circuit unit housing said decoder-driver circuits 5a and 5b, registor 7, A-D converters 10 and 11, and clock pulse generator 12 in one casing 64 in a packaged form, and both units just mentioned are mounted on the flexible printed circuit sheet 1 and the circuit unit 61 is connected to the photo-sensing element 8, the shutter 33 and the battery housing box 38 by the conductive paths 2 formed on said printed circuit sheet 1, while the circuit unit 63 is connected to the circuit unit 61, the display means 40 containing only the light emitting elements 4a and 4b, and the battery housing box 38.

The details of connections of electric circuit in the printed circuit unit in this third Example are same as what is shown in FIG. 7.

Also what are shown as 65, 66 and 67 are variable resistors for circuit adjustment and are mounted on the printed circuit sheet 1, and the variable resistors 65 and 66 are connected to the circuit 61 and the variable resistor 67 is connected to the circuit unit 63, respectively by the conductive paths 2. And the above mentioned masking plate 13 is mounted on said display means 40 and the photo-sensing element 8.

Figure 11:
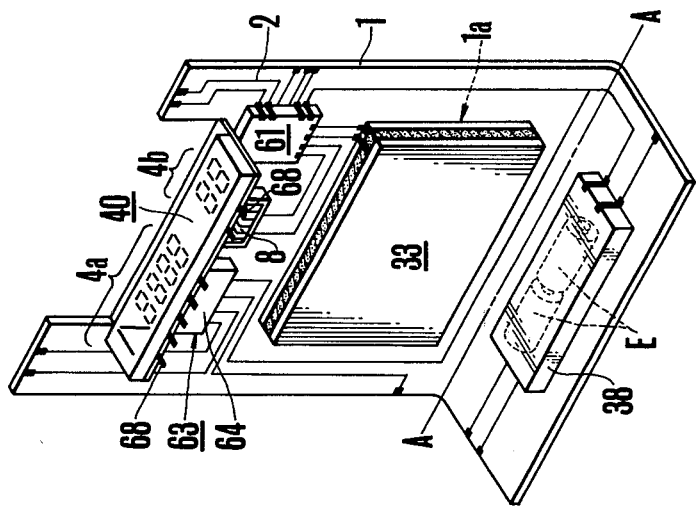
FIG. 11 is an external oblique view to show a set up of a fourth example of a printed circuit unit according to the present invention.
Figure 12:
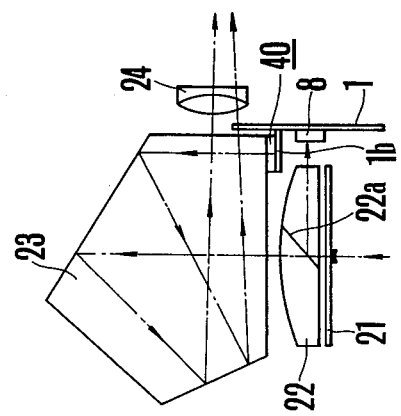
FIG. 12 is a schematic explanatory drawing to show a positional layout of especially a photo-sensing element and a display element in a view finder optical system of a single lens reflex camera when the printed circuit unit shown in FIG. 11 is mounted to said camera.

Next, FIG. 11, FIG. 12 are to show a modification of the third example shown in FIG. 10 as a fourth example of a printed circuit unit according to the present invention. And in this fourth example the masking plate 13 to prevent the display light beam by the light emitting elements 4a and 4b from impinging into the photo-sensing element 8, as shown in the First and Second Examples is not needed.

That is a bent part 1b is provided at the printed circuit sheet 1 in such manner as being bent just as forming eaves over the photo-sensing element 8, and the above mentioned display means 40 containing only the light emitting elements 4a and 4b for display is mounted on said bent part 1b, and is connected to the circuit unit 63 by the terminal group 68 thereof through the conductive paths 2.

Also, while the manner in which said printed circuit unit is mounted in a camera is as shown in FIG. 12, particularly the display means 40 needs to be fixed by an appropriate means. This may be done for example by such method as adhering the display means 40 to bottom plane of the penta prism 23.

Lastly explanations will be made on an example wherein a printed circuit unit can be mounted to a view finder adapter which is so made as freely mountable to and dismountable from a camera body as a fifth example of a printed circuit unit according to the present invention. In said drawings, what is shown as 70 is a flexible printed circuit sheet and has a first bent part 70a to have the display means 40 containing only the light emitting elements 4a and 4b mounted thereon, and a second bent part 70b to have the photo-sensing elements 8a and 8b mounted thereon, further it is bent depending on a shape of the penta prism 23 built in the finder adapter.

While said second bent part 70b, especially, is so bent that the photo-sensing elements 8a and 8b are made to closely face the light beam emergence plane 23a of the penta prism 23, a cut out part 70c is formed at said second bent part 70b so that the light beam emerging out of the light beam emergence plane 23a of the penta prism 23 especially out of its central part can impinge into the eye piece lens 24 without obstacle. And the above mentioned exposure operation circuit 9 and the circuit unit 63 for display shown in FIG. 10, FIG. 11 are mounted on such portion of the printed circuit sheet 70 as corresponding to "dach" surfaces of the penta prism 23, wherein said exposure operation circuit 9 is connected to the photo-sensing elements 8a and 8b and the circuit unit 63, while the circuit unit 63 is connected to the display means 40 by the conductive paths 2 formed by printing on said printed circuit sheet 70. Also what is shown as 71 is a terminal group for electric connection to the camera body and is connected to the conductive paths 2.

While the printed circuit unit having the above mentioned set up is bent according to the shape of the penta prism 23 as mentioned above and is housed in the adaptor housing 72, and display means 40, then, is fixed on a reflective prism 74 for display being adjoined to the light beam emergence plane 23a of the penta prism 23, so that the display information light beam generated by the light emitting elements 4a and 4b at said display means 40 will be impinged into the eye piece lens 24 through a reflective plane 74a of said prism 74. Also what is shown as 73 is an insulating type supporting plate to support said terminal group 71.

While the finder adaptor thus assembled is mounted to a camera body not being shown in the drawing, the electric connection between various electric parts provided at said camera body side and said printed circuit units is made through said terminal group 71, and in a state wherein the finder adapter is mounted to the camera body, for example circuits as shown in FIG. 3 are formed therebetween.

As has been explained above, the present invention is to provide one printed circuit unit for automatic exposure operation and display, being made of one or more circuit means which are made with IC's as much as possible and perform measurement of object brightness, operation of proper exposure based on the result of said measurement, and electro-optical display of the result of said operation, being placed on a flexible printed circuit sheet and being electrically connected by conductive paths formed by printing on said printed circuit sheet, wherein an opening is formed on said printed circuit sheet to allow the image light beam from a photo-taking lens system to impinge into film, and a cut out part is formed on the same to allow the light beam from the view finder optical system to be exited out to outside. Therefore according to said printed circuit unit the complicated wiring operation among a number of circuit paths or chips being scatteredly positioned in a camera conventionally required will become almost unnecessary, and at a same time it can be mounted utilizing the very limited spaces at the back part and the bottom part within the camera body or the limited space within the finder adapter being so made as freely mountable to and dismountable from said camera body, thus such fear can be completely eliminated as complicating the positional layout of various mechanical assemblies and optical assemblies within the camera or within the finder adapter.

Also since said printed circuit unit is made as one functional unit having functions of automatic exposure operation and electro-optical display of the result of said operation, a conventional camera can have functions of automatic exposure operation and display provided thereto instantly only by having such one functional unit, thus work required for assembly of a camera having function of automatic exposure operation and display can be remarkably reduced.

Furthermore, in the printed circuit unit of the present invention, even if a photo-sensing means and a display means are positioned very closely together, such design is made beforehand to effectively prevent such situation that the display information light beam from said display means impinges into the photo-sensing means therefore, even when said printed circuit unit is used together with a conventional optical assembly of camera, such fear as lowering the photo-sensing accuracy by the display information light beam from the display means can be prevented beforehand.

Also the present invention is to provide such printed circuit unit which can have a function of automatic exposure control by a so-called physico-optical electric shutter in addition to the functions of the above mentioned automatic exposure operation and electro-optical display of the result of said operation, therefore a conventional camera can have instantly function of automatic exposure control function in addition to the functions of automatic exposure operation and electro-optical display of the result of said operation only by having such functional unit which also has the function of automatic exposure control as mentioned above, thus the work in assembly of a camera of automatic exposure control type can be remarkably reduced.

Also, while the examples show a case where the above mentioned printed circuit unit functions as an automatic exposure operation unit of a so-called exposure aperture value preselection type in which proper exposure time value is automatically determined by presetting the exposure aperture value, the printed circuit unit of the present invention can be so made as functioning as an automatic operation unit of so-called exposure time value preselection type in which proper exposure aperture value is automatically determined by presetting exposure time value, depending on how the connections between said unit and the electric parts in a camera are made as it is mounted to the camera.

What is claimed is:

1. For a camera which is provided with:
   photo-taking lens system,
   view finder optical means, and
   aperture frame means to define a photographing picture frame,
   a printed circuit unit comprising:
   (A) photo-sensing means to measure the brightness of an object to be photographed by said camera, and to produce an electric signal corresponding to the object brightness,
   (B) exposure operation circuit means to determine a proper exposure value based on the output signal of said photo-sensing means, and to produce an electric signal corresponding to a proper exposure value,
   (C) a display means to electro-optically display the proper exposure value information based on the output signal from said exposure operation circuit means,
   (D) electrically insulating flexible circuit supporting means; said supporting means being adapted to be bent into a configuration to fit in a desired space within said camera and having an opening with a size at least equal to the size of the photographing picture frame defined by said aperture frame means, and
   (E) electrically conductive means being carried on said flexible supporting means,
   said photo-sensing means, said exposure operation circuit means and said display means being carried on said flexible supporting means, and said photo-sensing means and said display means being electrically connected to said exposure operation circuit means through said electrically conductive means, and
   said supporting means being constructed so that:
   said photo-sensing means is placed at a position to receive a light beam from said object through at least a part of said view finder optical means,
   said display means is placed at a position having the display informtion light beam display said proper exposure value information and impinge into at least a part of said view finder optical means, and
   said opening of the supporting means matches with said photographing picture frame defined by said aperture frame means, and is mounted in a camera so at least to utilize a restricted space near said aperture frame means.

2. A unit according to claim 1, in which said display means includes:
   light emitting means to digitally display the proper exposure value information,
   digital conversion circuit means to convert the output signal from said exposure operation circuit means into a digital signal, said converting circuit means being electrically connected to said exposure operation circuit means through said conductive means carried on said flexible supporting means and
   driving circuit means to electrically drive said light emitting means based on the digital signal produced from said digital conversion circuit means, said driving circuit means being electrically connected to said light emitting means and said digital conversion circuit means.

3. A unit according to claim 2, in which said digital conversion circuit means and said driving circuit means are made as integrated circuit chips respectively, and at least a portion of said exposure operation circuit means is made with IC's.

4. A unit according to claim 3, in which said light emitting means and said driving means are packaged as one circuit element.

5. A unit according to claim 3, in which said flexible electrically insulating circuit support means is made of a flexible solid organic resin.

6. A unit according to claim 5, in which said photo-sensing means and said light emitting means are mounted at a position on said flexible supporting means close to each other.

7. A unit according to claim 6, which further comprises light shielding means to prevent the display information light beam from said light emitting means from impinging on said photo-sensing means; said shielding means being located between the path of light from said light emitting means and the light path to said photo-sensing means.

8. A unit according to claim 7, in which said view finder optical means includes:
first optical means adapted to have at least a portion of the object light beam impinge on said photo-sensing means, and
second optical means adapted to introduce the display information light beam from said light emitting means,
wherein, said photo-sensing means is positioned close to said first optical means, and said light emitting means is positioned close to said second optical means, and said light shielding means is positioned between said first optical means and said second optical means.

9. A unit according to claim 1, in which said electrically insulating flexible circuit means has:
first portion to be housed in the above mentioned restricted space near the aperture frame means, and
second portion to be bent relative to said first portion and housed in a restricted space at the bottom of said camera,
the opening of the flexible supporting means being formed inside said first portion, said photo-sensing means and at least a part of said display means being positioned at said first portion, said exposure operation circuit means being positioned at said second portion.

10. A unit according to claim 1, in which said exposure operation circuit means determines a proper exposure time based on the output signal from said photo-sensing means, while said display means displays the proper exposure time information in response to the output signal from the exposure operation circuit means.

11. A printed circuit unit for a camera which is provided with:
a photo-taking lens system,
view finder optical means,
aperture frame means to define a photographic picture frame, and
setting means to electrically set one or more exposure factors, wherein said printed circuit unit comprises:
(A) photo-taking means to measure the brightness of an object to be photographed by said camera, said sensing means producing an electric signal corresponding to the object brightness,
(B) exposure operation circuit means to determine a proper exposure value based on the output signal from said photosensing means and the exposure factors provided by said setting means; said exposure operation circuit means producing an electric signal corresponding to the proper exposure value,
(C) display means to electro-optically display one or more exposure value informations,
(D) electrically insulating flexible circuit supporting means adapted to be bent into a configuration which fits in a desired shape within said camera and having an opening at least equal to the size of said picture frame defined by said aperture frame means, and
(E) electrical conductive means to provide electric connection among said photo-sensing means, said exposure operation circuit means, said display means and said setting means; said conductive means being mounted on said flexible supporting means,
said photo-sensing means, said exposure operation circuit means and said display means being carried on said flexible supporting means and being electrically connected to said conductive means, and said flexible supporting means being constructed so that
said photo-sensing means is positioned to be albe to receive a light beam from said object through at least a part of said view finder optical means, also
said display means positioned for having the display information light beam displaying said proper exposure value information impinge on at least a part of said view finder optical means, further,
said opening of the supporting means matches said photographing picture frame defined by said aperture frame means, and
is mounted in said camera utilizing a restricted space near said aperture frame means.

12. A unit according to claim 11, in which said setting means includes:
first electric means to provide film sensitivity information to said exposure operation circuit means, and
second electric means to provide a preset exposure aperture value information to said exposure operation circuit means,
said exposure operation circuit means being electrically connected to said first and second electric means through said conductive means carried on said flexible supporting means and determining a proper exposure time value based on the film sensitivity information provided by said first electric means, and the preset exposure aperture value information provided by said second electric means as well as the object brightness information provided by said photo-sensing means,
display means electro-optically displaying the proper exposure time value information based on the output signal from said exposure operation circuit means.

13. A unit according to claim 12, in which said display means is electrically connected to said second electric means through said conductive means carried on the supporting means and electro-optically displays and preset exposure aperture value information based on the electric signal from said second electric means, together with said proper exposure time value information.

14. A unit according to claim 11, in which said display means includes:
light emitting means to digitally display the proper exposure value information,
digital conversion circuit means to convert the output signal from said exposure operation circuit means into a digital signal, said converting circuit means being electrically connected to said exposure operation circuit means through said conductive means carried on said flexible supporting means, and driving circuit means to electrically drive said light emitting means based on the digital signal produced by said digital conversion circuit means, said driving circuit means being electrically connected to said light emitting means and said digital conversion circuit means.

15. A unit according to claim 14, in which said digital conversion circuit means and said driving circuit means are respective integrated circuit chips, and said exposure operation circuit means includes integrated circuits.

16. A unit according to claim 15, in which said light emitting means and said driving means are packaged as a single circuit element.

17. A unit according to claim 14, in which said flexible electrically insulating circuit support means is made of a flexible solid organic resin.

18. A unit according to claim 28, in which said photo-sensing means and said light emitting means are mounted close to each other on said flexible supporting means.

19. A unit according to claim 18, which further comprises a light shielding means to prevent the display information light beam from said light emitting means from impinging onto said photo-sensing means; said shielding means being located between the display light path of said light emitting means and the photo-sensing light path of said photo-sensing means.

20. A unit according to claim 19, in which said view finder optical means includes:
first optical means adapted to have at least a portion of the object light beam impinge on said photo-sensing means, and
second optical means adapted to introduce the display information light beam from said light emitting means,
said photo-sensing means being positioned close to said first optical means, and said light emitting means being positioned close to said second optical means, and said light shielding means being positioned between said first optical means and said second optical means.

21. A unit according to claim 11, in which said electrically insulating flexible circuit means has:
a first portion to be housed in the restricted space near the aperture frame means, and
a second portion to be bent against said first portion and housed in a restricted space at the bottom of said camera,
the above mentioned opening of the flexible supporting means being formed at inside of said first portion, and said photo-sensing means and at least a part of said display means being positioned at said first portion, said exposure operation circuit means being positioned at said second portion.

22. A printed circuit unit for a finder adapter which is dismountable from a camera body and is provided with:
view finder optical means, and
a housing to house said optical means, having an opening to make an object to be photographed observable through said optical means, wherein said printed circuit unit comprises:
(A) photo-sensing means to measure the brightness of an object and producing an electric output signal corresponding to the object brightness,
(B) exposure operation circuit means to determine a proper exposure value based on the output signal of said photo-sensing means; said circuit means producing an electric output signal corresponding to the proper exposure value,
(C) display means to electro-optically display the proper exposure value information on the basis of the output signal from said exposure operation circuit means,
(D) electrically insulating flexible circuit supporting means adapted to be bent into a configuration so as to fit in a desired space within said housing, and having one cut-out part corresponding to said opening of the housing,
(E) electrically conductive means carried on said flexible supporting means, said photo-sensing means as well as said exposure operation circuit means and said display means being carried on said flexible supporting means, and said photo-sensing means and said display means being electrically connected to said exposure operation circuit means through said electrically conductive means, and
(F) terminal means adapted to provide electric connection between said conductive means and said camera body; said terminal means being electrically connected to said conductive means and sticking out of said housing, said flexible supporting means being constructed so that:
said photo-sensing means is placed to be able to receive a portion of a light beam from said object through at least a part of said view finder optical means,
said display means is placed to be able to have the display information light beam to display said proper exposure value information impinge on at least a part of said view finder optical means,
said cut-out part corresponds to said opening of the housing, and
is mounted in a camera utilizing a restricted space within said housing.

23. A unit according to claim 22, in which said display means includes:
light emitting means to digitally display the proper exposure value information,
digital conversion circuit means to convert the output signal from said exposure operation circuit means into digital signal, said converting circuit means being electrically connected to said exposure operation circuit means through said conductive means carried on said flexible supporting means, and
driving circuit means to electrically drive said light emitting means on the basis of the digital signal produced by said digital conversion circuit means, said driving circuit means being electrically connected to said light emitting means and said digital conversion circuit means.

24. A unit according to claim 23, in which said digital conversion circuit means and said driving circuit means are respective integrated circuit chips, and said exposure operation circuit means includes integrated circuits.

25. A unit according to claim 24, in which said electrically insulating flexible supporting means is formed with a flexible solid organic resin.

26. A unit according to claim 25, in which said photo-sensing means is mounted on a plate portion of the supporting means where said cut-out part is formed, and is positioned between said optical means and said housing together with said cut-out part so as to be able to receive a portion of a light beam passing from said view finder optical means toward said opening of the housing.

27. A unit according to claim 26, in which said photo-sensing means includes two photo-sensing elements, which are mounted on said plate portion of the supporting means for sandwiching said cut-out part.

28. A printed circuit unit for a finder adapter which may be dismounted from a single lens reflex camera body setting means for electrically setting one or more exposure factors, and is provided with;
view finder optical means to make an image of an object to be photographed observable, and
a housing which houses said optical means and has an opening to make object image observable through said optical means,
wherein said printed circuit unit comprises:
(A) a photo-sensing means to measure the brightness of an object to produce an electric signal corresponding to the object brightness,
(B) an exposure operation circuit means to determine a proper exposure value based on the output signal from said photo-sensing means and the exposure factor of said setting means, and to produce an electric signal as corresponding to the proper exposure value,
(C) a display means to electro-optically display one or more exposure value informations,
(D) electrically insulating flexible circuit supporting means adapted to be bent into a configuration so as to fit in a desired space within said housing and having one cut-out part corresponding to said opening of the housing,
(E) electrically conductive means for electric connection of said photo-sensitive means, said exposure operation circuit means and said display means, wherein said electrically conductive means is carried on said flexible supporting means, and said photo-sensing means, said exposure operation circuit means and said display means are carried on said flexible supporting means and electrically connected to said conductive means, and
(F) a terminal to provide electric connection between said conductive means and said setting means, and is electrically connected to said conductive means so as to stick out of said housing,
said flexible supporting means being mounted in a camera utilizing a restricted space within said housing in such manner that:
said photo-sensing means is placed at a position to be able to receive alight beam from said object through at least a part of said view finder optical means,
said display means is placed at a position having the display information light beam for displaying said proper exposure value information impinge on at least a part of said view finder optical means, and
said cut-out part corresponds to said opening of the housing.

29. A unit according to claim 28, in which said setting means includes:

first electric means for providing film sensitivity information to said exposure operation circuit means, and
second electric means for providing a preset exposure aperture value information to said exposure operation circuit means,
said exposure operation circuit means being electrically connected to said first and second electric means through said conductive means carried on said flexible supporting means and determining a proper exposure time value based on the film sensitivity information from said first electric means and the preset exposure aperture value information given by said second electric means as well as the object brightness information given by said photo-sensing means, and
said display means electro-optically displaying the proper exposure time value information based on the output signal from said exposure operation circuit means.

30. A unit according to claim 29, in which said display means is also electrically connected to said second electric means through said conductive means carried on the supporting means and electro-optically display the preset exposure aperture value information based on the electric signal given by said second electric means and said proper exposure time value information.

31. A unit according to claim 28, in which said display means includes:
light emitting means to digitally display the proper exposure value information,
digital conversion circuit means to convert the output signal from said exposure operation circuit means into a digital signal, said converting circuit means being electrically connected to said exposure operation circuit means through said conductive means carried on said flexible supporting means, and
driving circuit means to electrically drive said light emitting means based on the digital signal produced from said digital conversion circuit means, said driving circuit means being electrically connected to said light emitting means and said digital conversion circuit means.

32. A unit according to claim 31, in which said digital conversion circuit means and said driving circuit means are respective integrated circuit chips, and said exposure operation circuit means includes integrated circuits.

33. A unit according to claim 32, in which said electrically insulating flexible supporting means is formed with a flexible solid organic resin.

34. A unit according to claim 33, in which said photog-sensing means is mounted on a plate portion of the supporting means where said cut-out part is formed, and is positioned between said optical means and said housing together with said cut-out part so as to be able to receive a portion of a light beam being passing from said view finder optical means toward said opening of the housing.

35. A unit according to claim 34, in which said photo-sensing means includes two photo-sensing elements mounted on said plate portion of the supporting means for sandwiching said cut-out part.

* * * * *